(12) United States Patent
Kim

(10) Patent No.: US 7,065,738 B1
(45) Date of Patent: Jun. 20, 2006

(54) METHOD OF VERIFYING AN OPTICAL PROXIMITY CORRECTION (OPC) MODEL

(75) Inventor: Hung-Eil Kim, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 142 days.

(21) Appl. No.: 10/838,668

(22) Filed: May 4, 2004

(51) Int. Cl.
*G06F 17/50* (2006.01)

(52) U.S. Cl. .......................................... 716/19; 716/21

(58) Field of Classification Search ................. 716/19, 716/21
See application file for complete search history.

(56) References Cited

U.S. PATENT DOCUMENTS

| | | | | |
|---|---|---|---|---|
| 5,879,844 A * | 3/1999 | Yamamoto et al. | ........... | 430/30 |
| 6,243,855 B1 | 6/2001 | Kobayashi et al. | ........... | 716/19 |
| 6,289,499 B1 * | 9/2001 | Rieger et al. | ................. | 716/21 |
| 6,415,421 B1 | 7/2002 | Anderson et al. | ............. | 716/19 |
| 6,420,077 B1 * | 7/2002 | Chen et al. | ................... | 430/30 |
| 6,425,113 B1 | 7/2002 | Anderson et al. | ............. | 716/19 |
| 6,577,994 B1 * | 6/2003 | Tsukuda | ...................... | 703/15 |
| 6,584,609 B1 * | 6/2003 | Pierrat et al. | ................. | 716/19 |
| 6,952,818 B1 * | 10/2005 | Ikeuchi | ......................... | 716/21 |
| 2001/0017693 A1 * | 8/2001 | Zheng et al. | ................. | 355/77 |
| 2003/0149955 A1 * | 8/2003 | Ohnuma | ...................... | 716/19 |

OTHER PUBLICATIONS

Balasinski et al., "Comparison of Mask Writing Tools and Mask Simulations for 0.16um Devices", Sep. 1999, IEEE Advanced Semiconductor Manufacturing Conference and Workshop, Paper Digest, pp. 372-377.*

Yamamoto et al., "Hierarchical Optical Proximity Correction on Contact Hole Layers", Jul. 2000, IEEE International Microprocesses and Nanotechnology, Paper Digest, pp. 40-41.*

Granik et al., "Sub-Resolution Process Windows and Yield Estimation Technique Based on Detailed Full-Chip CD Simulation," Mentor Graphics, Sep. 2000.

Schellenberg et al., "A New Process Monitor for Reticles and Wafers: The MEEF Meter," Mentor Graphics, presented at SPIE's Microlithography 2000 Symposium.

Schulze et al., "A GDS-Based Mask Data Preparation Flow—Data Volume Containment by Hierarchical Data Processing." Mentor Graphics, Nov. 2002.

Schellengerg et al., "Verifiable OPC Methodologies," Mentor Graphics, Mar. 1999.

* cited by examiner

*Primary Examiner*—Sun James Lin
(74) *Attorney, Agent, or Firm*—Renner, Otto, Boisselle & Sklar, LLP

(57) ABSTRACT

A method verifying an optical proximity correction (OPC) model is disclosed. The method can include correcting a test pattern having a plurality of structures and extracting critical dimension (CD) values from a corrected output file for layout locations corresponding to a plurality of selected structures of the test pattern. A data set from the extracted CD values can be developed where the data set is indicative of corrected test pattern CD versus pitch for at least one target CD. Also disclosed is a method of collecting wafer test measurement data.

7 Claims, 3 Drawing Sheets

METHOD OF VERIFYING AN OPTICAL PROXIMITY CORRECTION (OPC) MODEL

TECHNICAL FIELD

The present invention relates generally to the field of integrated circuit manufacture and, more particularly, to a method of generating wafer test measurements and a method of using wafer test measurements to verify one or more optical proximity correction (OPC) models.

BACKGROUND

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, patterns can be formed from a photo resist layer disposed on the wafer by passing light energy through a photomask having an arrangement to image the desired pattern onto the photo resist layer. As a result, the pattern is transferred to the photo resist layer. In areas where the photo resist is sufficiently exposed and after a development cycle, the photo resist material can become soluble such that it can be removed to selectively expose an underlying layer (e.g., a semiconductor layer, a metal or metal containing layer, a dielectric layer, a hard mask layer, etc.). Portions of the photo resist layer not exposed to a threshold amount of light energy will not be removed and serve to protect the underlying layer during further processing of the wafer (e.g., etching exposed portions of the underlying layer, implanting ions into the wafer, etc.). Thereafter, the remaining portions of the photo resist layer can be removed.

There is a pervasive trend in the art of IC fabrication to increase the density with which various structures are arranged. For example, feature size, line width, and the separation between features and lines are becoming increasingly smaller. For example, nodes with a critical dimension (CD) of about 45 nanometers (nm) to about 65 nm have been proposed. In these sub-micron processes, yield is affected by factors such as mask pattern fidelity, optical proximity effects and photo resist processing. Some of the more prevalent concerns include line end pullback, corner rounding and line-width variations. Contact holes may also have a tendency to bridge and/or shift from a desired location. These concerns are largely dependent on local pattern density and topology.

Optical proximity correction (OPC) has been used to improve image fidelity. In general, current OPC techniques involve executing an OPC software program with accompanying OPC scripts. The OPC program/scripts carry out a computer simulation that takes an initial data set having information relating the desired pattern and manipulates the data set to arrive at a corrected data set in an attempt to compensate for the above-mentioned concerns. The photomask can then be made in accordance with the corrected data set. Briefly, the OPC process can be governed by a set of optical rules (e.g., "rule-based OPC" employing fixed rules for geometric manipulation of the data set), a set of modeling principles (e.g., "model-based OPC" employing predetermined behavior data to drive geometric manipulation of the data set) or a hybrid combination of rule-based OPC and model-based OPC.

Prior to correcting a data set using model-based or hybrid OPC, it may be desirable to verify the operation of the OPC model upon which the OPC routine relies and/or to select one of a plurality of OPC models to be used during the OPC routine. To date, techniques for evaluating OPC models involve intensively manual processes that is time consuming and prone to errors and/or omissions. Briefly, verifying OPC models involve hand checking the layout corrections made to a test pattern to verify that the OPC routine applying the OPC model performs in an expected manner.

Accordingly, there exists a need in the art for an improved methodology of verifying OPC models and for collected data against which the corrections of the OPC models can be compared.

SUMMARY OF THE INVENTION

According to one aspect of the invention, the invention is directed to a method of verifying an optical proximity correction (OPC) model for use with an OPC simulation tool that manipulates an integrated circuit layout corresponding to a layer to be embodied in a wafer by a photolithographic technique. The method can include: a) correcting a test pattern having a plurality of structures with the OPC simulation tool using the OPC model to generate a corrected output file for the test layout; b) extracting critical dimension (CD) values from the corrected output file for layout locations corresponding to a plurality of selected structures of the test pattern; and c) developing a data set from the extracted CD values, the data set indicative of corrected test pattern CD versus pitch for at least one target CD.

A further aspect of the method of verifying can include comparing the data set for the extracted CD values with an experimentally derived data set, the experimentally derived data set indicative of reticle opening CD versus pitch that when imaged using the photolithographic technique produce wafer structures having the at least one target CD.

According to another aspect of the invention, the invention is directed to a method of collecting wafer test measurement data. The method can include a) providing a wafer having one or more arrays of contact holes, the contact holes formed by imaging the wafer with a reticle having openings arranged to have variations in critical dimension (CD) and pitch; b) executing a script to control a measurement tool to automatically identify selected contact holes and measure a CD value associated with the selected contact holes; and c) generating a data set of measured CD versus pitch for each opening CD variation.

BRIEF DESCRIPTION OF DRAWINGS

These and further features of the present invention will be apparent with reference to the following description and drawings, wherein.

DISCLOSURE OF INVENTION

Figure 1:
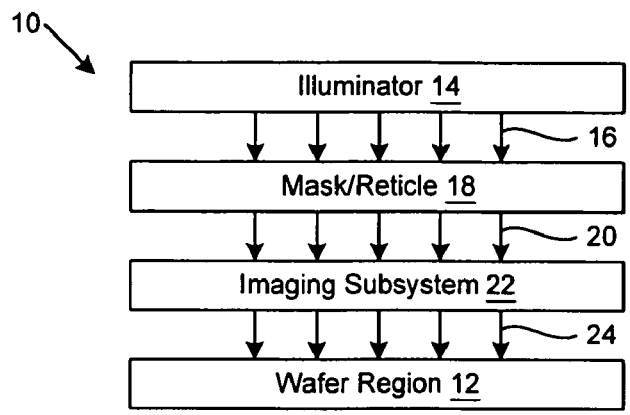
FIG. 1 is a schematic block diagram of a exemplary integrated circuit processing arrangement.

In the detailed description that follows, corresponding components have been given the same reference numerals, regardless of whether they are shown in different embodiments of the present invention. To illustrate the present invention in a clear and concise manner, the drawings may not necessarily be to scale and certain features may be shown in somewhat schematic form.

One aspect of the invention relates to a method of collecting wafer test measurement data. For example, one or more arrays of test contact holes can be printed onto a wafer. A critical dimension (CD) of selected contact holes can be measured using, for example, an automated scanning tool. In one embodiment, once the CD measurements are taken, data sets (e.g., such as in the form of plots) can be generated that can be used in the verification and/or selection of an optical proximity correction (OPC) model for use with an OPC routine.

Another aspect of the present invention relates to a method of verifying and/or selecting an OPC model. A test pattern can be corrected using an OPC routine for each of a plurality of OPC models. Software can be used to extract mask data from the corrected layouts and, in one embodiment, the extracted data can be plotted. The extracted data and the experimental data (e.g., the above-mentioned wafer test measurement data) can be compared to verify that the model operates within acceptable limits and/or to select which of a plurality of OPC models is most likely to behave as desired during correction of an actual integrated circuit layout to be corrected using the OPC routine.

The present invention will be described in the exemplary context of the preparation process for ultimate patterning a layer of material (e.g., a polysilicon gate or word line layer, a dielectric layer, a source/drain layer, a metal interconnect layer, a contact layer, etc.) that forms a part of an integrated circuit. Example integrated circuits include general use processors made from thousands or millions of transistors, a flash memory array or any other dedicated circuitry. However, one skilled in the art will appreciate that the methods, software tools and devices described herein can also be applied to the process of manufacturing any article made using photolithography, such as micromachines, disk drive heads, gene chips, micro electromechanical systems (MEMS) and so forth.

Referring to FIG. 1, illustrated is a schematic block diagram of an exemplary integrated circuit processing arrangement that includes a lithography system 10 used to image a pattern onto a wafer 12, or a region thereof. The system 10 can be, for example, a step-and-repeat exposure system or a step-and-scan exposure system, but is not limited to these example systems. The system 10 can include an illuminator 14 for directing radiation 16 (e.g., light) towards a photomask 18. The radiation 16 can have, for example, a deep ultraviolet wavelength (e.g., about 248 nm or about 193 nm) or a vacuum ultraviolet (VUV) wavelength (e.g., about 157 nm), although other wavelengths, including extreme ultraviolet wavelengths, are possible.

The mask 18 selectively blocks (or, in some instances, selectively reflects) the radiation 16 such that an energy pattern 20 defined by the mask 18 is transferred towards the wafer 12. An imaging subsystem 22, such as a stepper assembly or a scanner assembly, sequentially directs the energy pattern 20 transmitted by the mask 18 to a series of desired locations on the wafer 12. The imaging subsystem 22 may include a set of lenses and/or reflectors for use in scaling and directing the energy pattern 20 towards the wafer 12 in the form of an imaging (or exposure) energy pattern, referred to herein as an exposure dose 24.

Figure 2:
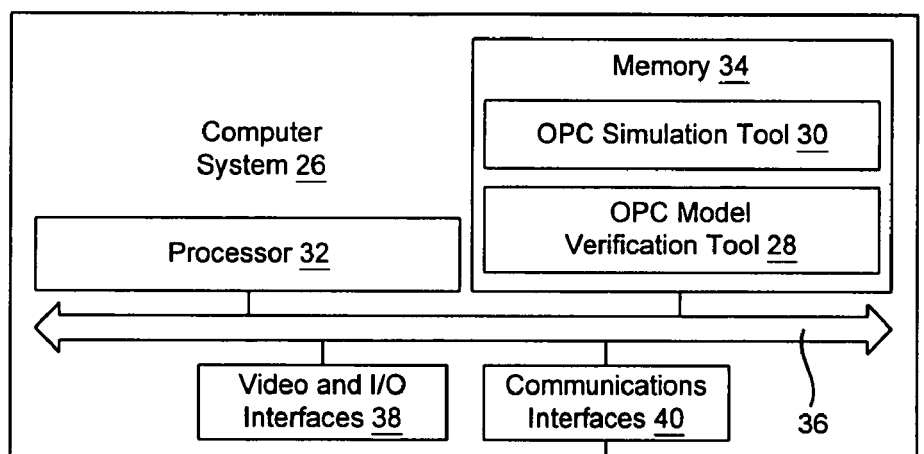
FIG. 2 is a schematic block diagram of a computer system capable of executing an optical proximity correction (OPC) model verification tool.

Turning now to FIG. 2, a schematic block diagram of a computer system 26 capable of executing an OPC model verification tool 28 in accordance with aspects of the present invention is illustrated. As will be described in greater detail, the OPC model verification tool 28 can work in cooperation with an OPC simulation tool 30 that can also be executed by the computer system 26. The OPC simulation tool 30 can be integral with the OPC model verification tool 28 or can be can embodied in stand alone software that is optionally called by the OPC model verification tool 28. In another embodiment, the OPC model verification tool 28 can be called by the OPC simulation tool 30. In one embodiment, the OPC model verification tool 28 and/or the OPC simulation tool 30 are embodied as one or more computer programs (e.g., one or more software applications including compilations of executable code). The computer program(s) can be embodied on (e.g., stored by) a computer readable medium, such as a magnetic, optical or semiconductor storage device (e.g., hard disk, CD-ROM, DVD-ROM, flash memory, etc.).

To execute the OPC model verification tool 28 and/or the OPC simulation tool 30, the computer system 26 can include one or more processors 32 used to execute instructions that carry out a specified logic routine. In addition, the computer system 26 can have a memory 34 for storing data, software, logic routine instructions, computer programs, files, operating system instructions, and the like. The memory 34 can comprise several devices and includes, for example, volatile and non-volatile memory components. As used herein, the memory 34 can include, for example, random access memory (RAM), read-only memory (ROM), hard disks, floppy disks, compact disks (e.g., CD-ROM, DVD-ROM, CD-RW, etc.), tapes, and/or other memory components, plus associated drives and players for these memory types. The processor 32 and the memory 34 are coupled using a local interface 36. The local interface 36 can be, for example, a data bus with accompanying control bus, a network, or other subsystem.

The computer system 26 can have various video and input/output interfaces 38 as well as one or more communications interfaces 40. The interfaces 38 can be used to coupled the computer system 26 to various peripherals and networked devices, such as a display (e.g., a CRT display or LCD display), a keyboard, a mouse, a microphone, a camera, a scanner, a printer, a speaker and so forth. The interfaces 40 can be comprised of, for example, a modem and/or network interface card, and can enable the computer system 26 to send and receive data signals, voice signals, video signals, and the like via an external network, such as the Internet, a wide area network (WAN), a local area network (LAN), direct data link, or similar wired or wireless system.

The memory 34 can store an operating system (not shown) that is executed by the processor 32 to control the allocation and usage of resources in the computer system 26. Specifically, the operating system controls the allocation and usage of the memory 34, the processing time of the processor 32 dedicated to various applications being executed by the processor 32, and the peripheral devices, as well as performing other functionality. In this manner, the operating system serves as the foundation on which applications, such as the OPC model verification tool 28 and/or the OPC simulation tool 30, depend as is generally known by those with ordinary skill in the art.

Figure 3:
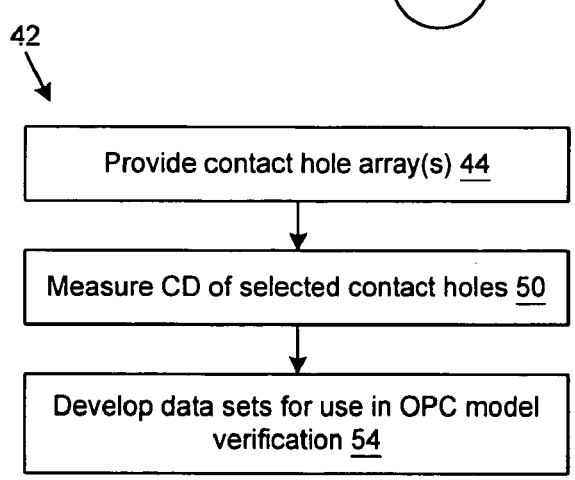
FIG. 3 is a flow chart of an example embodiment of a method for collecting wafer test measurement data.

With additional reference to FIG. 3, shown is a flow chart of an example embodiment of a wafer test measurement data collection component 42 of the OPC model verification tool 28. The flow chart of FIG. 3 can be thought of as depicting steps of a method implemented in the computer system 26. The method described herein uses contact holes to collect wafer test measurement data. However, it should be appreciated that other types of structures can be used to attain the results described herein, such as lines, gate electrodes and so forth.

Figure 4:
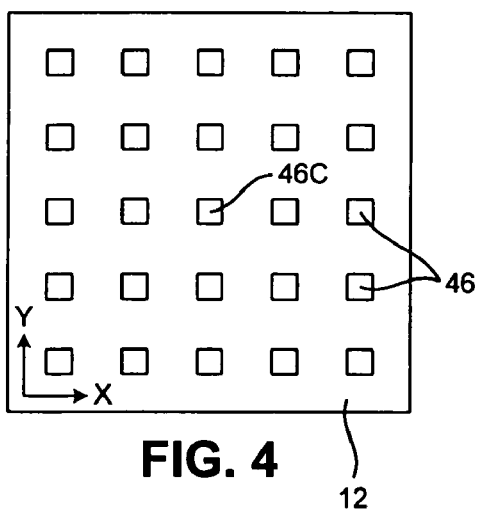
FIG. 4 is a portion of a wafer having an arrangement of contact holes formed therefrom.
Figure 5:
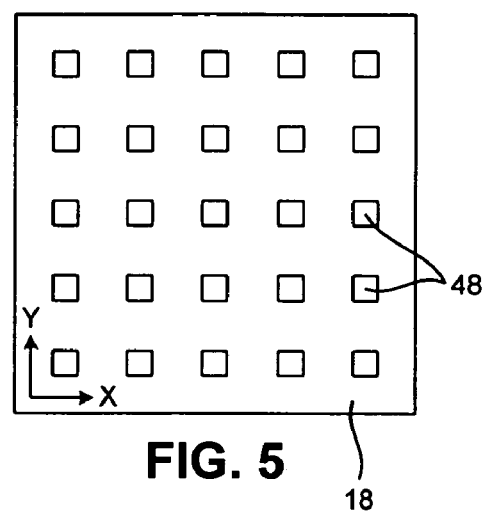
FIG. 5 is a portion of a reticle having an arrangement of openings corresponding to the contact holes of FIG. 4.

The method, as specified by the OPC model verification tool 28, can begin in block 44 where at least one wafer 12 having an arrangement of contact holes 46 printed thereon is provided. FIG. 4 shows only a portion of the wafer 12 in a dramatically enlarged form. The example wafer 12 portion contains a 5×5 matrix of contact holes 46. However, as will become more apparently below, a large number of contact holes 46 can be provided to furnish printed versions of a wide variety of corresponding reticle 18 features and illumination parameters. The contact holes 46 can be arranged in one or more arrays, and/or on one or more wafers. FIG. 5 shows a portion of a reticle 18 used to image the illustrated example 5×5 matrix of contact holes 46. In the example, the reticle 18 portion has a 5×5 matrix of energy transmitting openings 48 corresponding to the contact holes 46 formed on the wafer 12.

It is noted that the contact holes 46 can take on a number of physical forms, such as holes in a layer of photo resist material or holes is a layer of isolating material (e.g., silicon oxide). The contact holes 46 can be filled (e.g., with a conductive material) or left unfilled.

As indicated, the contact holes 46 are formed using a wide variety of reticle 18 features. For instance, the pitch and critical dimension (CD) of the corresponding reticle 18 openings 48 can be varied. In one embodiment, for each of a selected number of CD sizes for the openings 48, contact holes 46 can be printed through a selected number of pitches. The CD sizes can be selected by selecting an opening 48 CD range (e.g., about 50 nm to 300 nm) and incrementing the CD through the range (e.g., in increments of about 1 nm to about 5 nm). The pitch for the openings 48 can be similarly selected, such as using a pitch range of about 100 nm to greater than 1,000 nm and incrementing the pitch in increments of about 3 nm to about 20 nm. A pitch of greater than 1,000 nm is a pitch where the openings 48 are not likely to optically interfere with one another during imaging of the wafer and effectively can be considered isolated from one another. The pitch can be varied in one of an X direction or a Y direction, or, preferably, in both directions simultaneously. If pitch is varied simultaneously in the both the X and Y directions, the variations in the X and Y directions are preferably made to be the same, but could be varied at different rates. Also, the openings 48 need not be arranged in a uniform format and can include random layout sections, variable proximities among openings, symmetric areas, partially symmetric areas and/or non-symmetric areas.

Other possible reticle 18 variations for the openings 48 include, for example, modifying an X/Y bias of the openings 48. For example, certain openings 48 can have a slightly larger dimension in an X direction than in a Y direction or certain openings 48 can have a slightly larger dimension in the Y direction than in the X direction. To cover a range of X/Y biases, modifications to the X/Y bias can be made in the similar fashion to the foregoing incremented approach for CD and pitch.

Contact holes 46 can be printed for each desired permutation of CD, pitch, X/Y bias and any other variation of opening 48 feature that is desired. These variations can be imaged onto the wafer 12 to print one large array of contact holes 46 or multiple arrays, where each array contains contact holes 46 corresponding to one or more opening 48 variations.

In addition, contact holes 46 can be printed for variations in illumination parameters and reticle 18 type. To name a few examples, various types of illuminators can be used (e.g., annular, single-pole, dipole and quadri-pole illumination), variations within illuminator type can be used (e.g., for an annular illuminator, varying inside and outside sigma ($\sigma$)), various reticle transmission values can be used, and so forth. Other examples include, but are not limited to, variations in numerical aperture (NA), variations in K factor, variations in mask type (e.g., phase shifting, alternating phase shifting, etc.), and so forth.

In one embodiment, a set of openings 48 that each have the same or nearly the same features are used to form corresponding sets of the contact holes 46. For instance, individual matrices of contact holes 46 or sections of a larger contact hole 46 array can be formed from corresponding matrices of openings 48 that have the same or nearly the same features (e.g., openings 48 that each have generally the same CD, pitch, X/Y bias, etc.). The set of openings 48 for each corresponding area of contact holes 46 can be, for example, a 5×5 matrix of openings 48.

As should be apparent, hundreds, thousands of even millions of contact holes 46 can be provided in block 44. Each contact hole 46 or set of contact holes 46 can corresponding to a specific group of opening 48 features and/or illumination variables.

With continued reference to FIG. 3, after the array(s) of contact holes 46 are provided, aspects of the contact holes 46 can be measured in block 50. For instance, the CD of select contact holes 46 can be measured. In the embodiment where areas of contact holes 46 for each set of opening 48 variables are formed from a corresponding set of openings 48 having generally constant features, the CD of a centrally located contact hole 46C for each contact hole 46 area can be measured. Without intending to be bound by theory, it is believed that contact holes 46 that are centrally located with other contact holes 46 formed using openings 48 having the same of similar features provide quality references for generating wafer test measurement. In addition, the CD of select contact holes 46 having non-regular layouts can be measured.

As indicated, the number of permutations of opening 48 features (e.g., CD, pitch, X/Y bias, etc.) and optical parameters (e.g., illuminator 14 type, NA and other exposure setting) can be quite large. Therefore, the measurements taken in block 50 can be automated. In one embodiment, the wafer test measurement data collection component 42 of the OPC model verification tool 28 can be programmed to control a measurement tool 52 (FIG. 2) that is operatively connected to the computer system 26. The measurement tool 52 can be controlled to locate each contact hole 46 for which a measurement is desired and measure a desired parameter.

In one embodiment, the desired parameter to be measured is size of the contact hole 46, such as contact hole 46 CD.

Accordingly, the measurement tool 52 can be any appropriate measuring apparatus, such as a scanning electron microscope (SEM).

In the embodiment where uniform areas of contact holes 46 for each set of opening 48 variables are formed, the wafer test measurement data collection component 42 can control the measuring tool 52 to locate a centrally located contact hole 46C. For instance, image recognition software can be used to optically recognize each area (or matrix) of contact holes 46 and then locate the centrally located contact hole 46C. Once located, the CD of the centrally located contact hole 46C can be measured using an automated measurement function. The measured CDs can be stored in logical association with the features of the corresponding opening 48 and illumination parameters employed during such imaging.

After each contact hole 46 selected for measurement is located and measured, the operational logic for the wafer test measurement data collection component 42 can proceed to block 54 where data sets can be developed from the contact hole 46 measurements. In one embodiment, these data sets can be developed for use in OPC model verification and/or selection.

Figure 6:
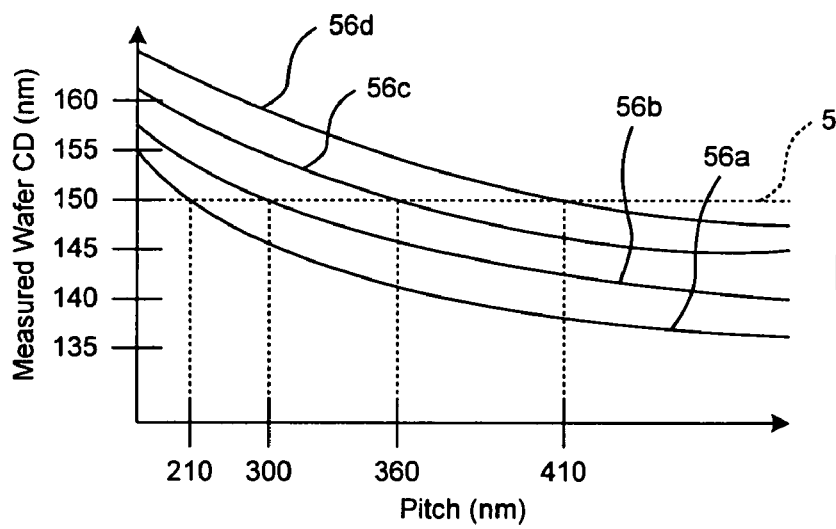
FIG. 6 is a graph of test measurement data in terms of measured wafer dimension versus pitch for a plurality of mask opening sizes.

With additional reference to FIG. 6, the data sets can be embodied in a set of plots, such as mask CD curves 56. Although only four example mask CD curves 56 are illustrated, it should be appreciated that any number of mask CD curves 56 as are needed to graph the performance of each opening 48 CD under varying illumination parameters can be plotted. In other embodiments, the data sets can be embodied on other forms, such as in a database structure or in one or more tables. As an example, mask CD curve 56*a* can represent how an opening 48 CD size of about 120 nm actually prints for a variety of pitches. Following this example, mask CD curve 56*b* can represent an opening 48 CD size of about 127 nm; mask CD curve 56*c* can represent an opening 48 CD size of about 135 nm; and mask CD curve 56*d* can represent an opening 48 CD size of about 140 nm.

The plot of FIG. 6 shows measured wafer CD (e.g., the measurements taken in processing block 50) graphed versus pitch for each permutation of opening 48 feature and illumination variable. In the illustrated example, each mask CD curve 56 shows the measured CD (e.g., the contact hole 46 size that actually printed) for a given opening 48 CD size (e.g., mask CD) through the various pitches. It should be appreciated that the x-axis values (pitch) and y-axis values (measured wafer CD) in the plots of FIG. 6 are merely exemplary. Also, the general shape of the mask CD curves 56 are exemplary and actual plots of the data sets can be expressed as multi-polynomial functions.

Using the mask CD curves 56, the mask opening 48 size that can print a target contact hole 46 CD size for a given pitch can be determined, such as by back correlation. For example, using the example plots of FIG. 6, if a constant target contact hole CD size (indicated by dashed horizontal line 58) of about 150 nm were desired, then the corresponding mask opening CD sizes at various pitches for the contact holes can be determined. Such a determination can be made by finding the intersection of the mask CD curves 56 with the target CD line 58. In the illustrated example, to print a 150 nm target CD contact hole at a pitch of about 270 nm, a 120 nm mask opening can be used (e.g., corresponding to example mask CD curve 56*a*). Similarly, to print a 150 nm target CD contact hole at a pitch of about 300 nm, a 127 nm mask opening can be used (e.g., corresponding to example mask CD curve 56*b*); to print a 150 nm target CD contact hole at a pitch of about 360 nm, a 135 nm mask opening can be used (e.g., corresponding to example mask CD curve 56*c*); and to print a 150 nm target CD contact hole at a pitch of about 410 nm, a 140 nm mask opening can be used (e.g., corresponding to example mask CD curve 56*d*).

Figure 7:
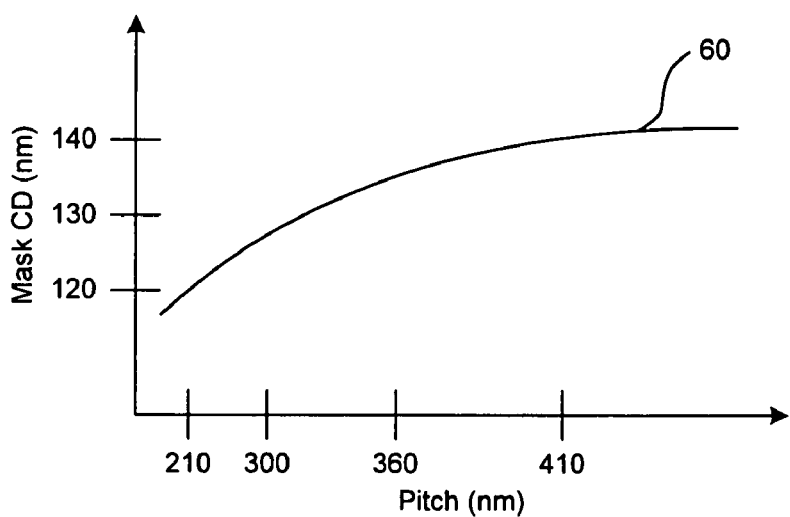
FIG. 7 is a graph of mask CD used to generate a constant measured wafer dimension across pitch.

The relationship between mask opening CD and pitch can be plotted for a given printed target CD. For example, using the example curves of FIG. 6 and a target printed CD of 150 nm, FIG. 7 illustrates is a target curve 60 showing the mask CDs (y axis) that can be used to print to the example 150 nm contact holes over a range of pitches (x axis).

The foregoing general technique for determining the mask opening CDs over pitch that can produce a constant target printed CD can be adapted to determine the mask opening CDs over pitch that can produce a variable target printed CD. For example, multiple target curves 60 or data points can be plotted for each target CD at a particular pitch or range of pitches.

Figure 8:
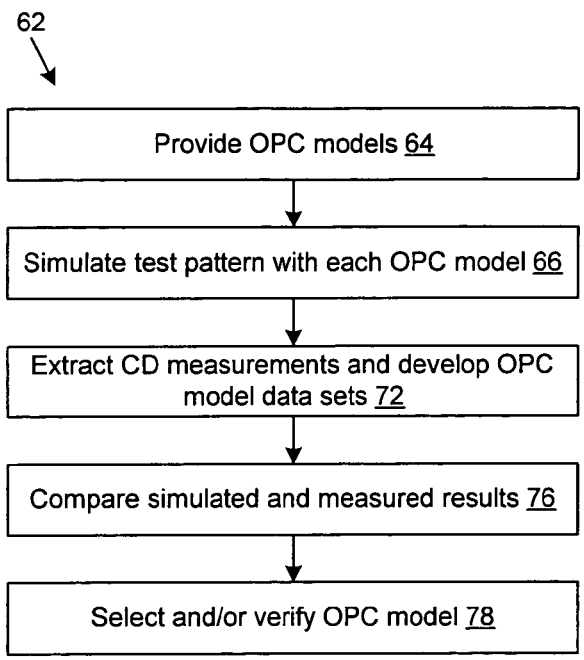
FIG. 8 is a flow chart of an example embodiment of a method for verifying and/or selecting an OPC model.

With additional reference to FIG. 8, shown is a flow chart of an example embodiment of an OPC model verification/selection component 62 of the OPC model verification tool 28. The flow chart of FIG. 8 can be thought of as depicting steps of a method implemented in the computer system 26. The method described herein uses contact holes as a basis of OPC model verification and/or selection. However, it should be appreciated that other types of structures can be used to attain the results described herein, such as lines, gate electrodes and so forth.

The method, as specified by the OPC model verification tool 28, can begin in block 64 where one or more OPC models are provided. The OPC models can optionally be stored by the memory 34. The OPC models can be used by the OPC simulation tool 30 to drive corrections made to an integrated circuit layout as part of a model-based or hybrid (combination of rules and models) OPC routine. Typically, OPC models are multi-term mathematical expressions for representing the behavior of multiple lithography conditions, such as feature proximity, image log slope, illumination intensity, contrast, fragmentation complexity, depth of focus, etc.

Often, multiple OPC models are developed for a particular OPC process. Multiple OPC models are sometimes developed since is it often difficult to assess the corrective behavior of any particular OPC routine when driven by any particular model. Therefore, the OPC models can be developed, tested or evaluated, and then refined and/or prioritized for use in correcting integrated circuit layouts. Multiple OPC models can also provide options as to how the OPC simulation tool 30 makes corrections, thereby enhancing flexibility in correcting an integrated circuit layouts based on geometrical content of the layout.

Following block 64, the OPC model verification tool 28 can simulate corrections to a reticle test pattern in block 66 for each OPC model. It is noted that the reticle test pattern for purposes of OPC model verification/selection can be a pattern constructed for use in the process described herein or can be an actual layout (or portion thereof) for a layer of an integrated circuit. In one embodiment, the OPC model verification tool 28 can call the OPC simulation tool 30 to make the corrections to the test pattern. OPC techniques are generally known in the art and will not be described in great detail. Briefly, the OPC process can involve iteratively refining a pattern using an edge placement error (EPE) value as a benchmark for the compensating process. In some OPC processes, the features and lines of the desired (or target) pattern are broken into edge fragments (or edge segments). The fragmented data set is manipulated based on rules and/or models. For example, the edge fragments can be moved inward or outward. Then, a simulation can be run to determine predicted placement of the edges by simulated "imaging" (or "printing") of the manipulated pattern onto a wafer. The predicted edges are compared against their desired placement; and, when the simulation of the printing of the test pattern converges upon the desired layout with acceptable limits, the OPC routine can end.

Figure 9:
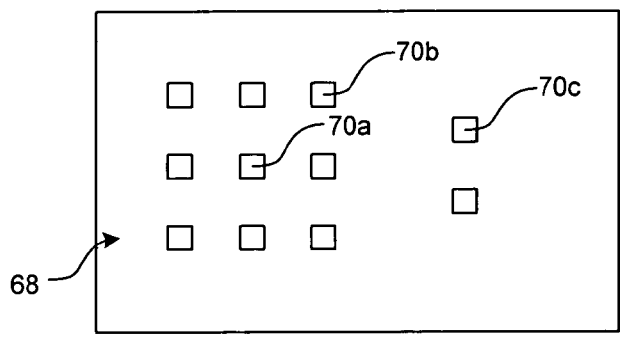
FIG. 9 is an example test pattern used during OPC model verification/selection.

With additional reference to FIG. 9, an example reticle test pattern 68 for correction using an OPC routine as defined by the OPC simulation tool 30 is shown. The test pattern 68 is separately corrected for each OPC model. The example test pattern 68 includes an arrangement of reticle openings 70 that correspond to desired contact holes. The openings 70 can be arranged in regular arrays, with a random layout, with variable proximities, with symmetrical areas, with partially symmetrical areas, with non-symmetrical areas, and combinations of these layout arrangements. Therefore, portions of the test pattern 68 can be arranged as a regular array of openings 70 and/or with a non-uniform opening 70 topology. In this manner, the test pattern 68 can include, for example, relatively dense areas of openings 70 (e.g., example opening 70a located and the center of a matrix of openings and example opening 70b located at an edge of the matrix of openings) and relatively isolated areas of openings 70 (e.g., example opening 70c that forms a part of an isolated opening pairing, sometimes referred to as a twin).

In one embodiment, the OPC corrections using each OPC model can be made to attempt to make each simulated contact hole corresponding to the openings a uniform size. For purposes of presenting a straight-forward example of the method of OPC model verification and simulation, the target simulated contact hole CD can be constant, such as about 150 nm. However, it should be understood that the constant CD target example is considered to be non-limited as the methods described herein can be adapted to accommodate variable CD targets through pitch. Variable CD targets are likely to be encountered in actual integrated circuit layout processing due to merging issues at dense topologies, small depth of focus margin at isolated pitches, non-lithographic shrink techniques, and so forth.

As is known in the art, the test pattern 68 can be stored in the form of a technology file (or "tech" file) containing a representation of the layout of the test pattern 68. For example, tech files are often populated with polygons in a particular file format, such as GDSII. The corrected versions of the test pattern 68 can be stored in respective corrected, or final, tech files.

After the reticle test pattern 68 has been corrected using each OPC model, a corresponding corrected tech file can be output by the OPC model verification tool 28 and stored. Thereafter, the logic can continue in block 72 where the corrected CD measurements for selected openings 70 can be extracted from each corrected tech file. As should be appreciated, the extracted data can be simulated mask opening sizes corresponding to the selected openings 70 of the original test pattern 68. The selected openings 70 for which CD measurements are extracted can be selected to represent various contact hole pitches. In one embodiment, the extraction of data can be made by specifying a plurality of coordinates corresponding to desired locations, such as location relating to critical patterns and/or positions within the test pattern 68. Depending on the format of the corrected tech file, extracting the CD values may include mathematical manipulation of data contained in the tech file to obtain the desired dimension values.

The extraction of corrected opening CD measurements can be automated. For example; the OPC model verification tool 28 can be programmed to parse the corrected tech files for the desired locations and develop data sets containing Cd measurements for each corrected tech file.

Figure 10:
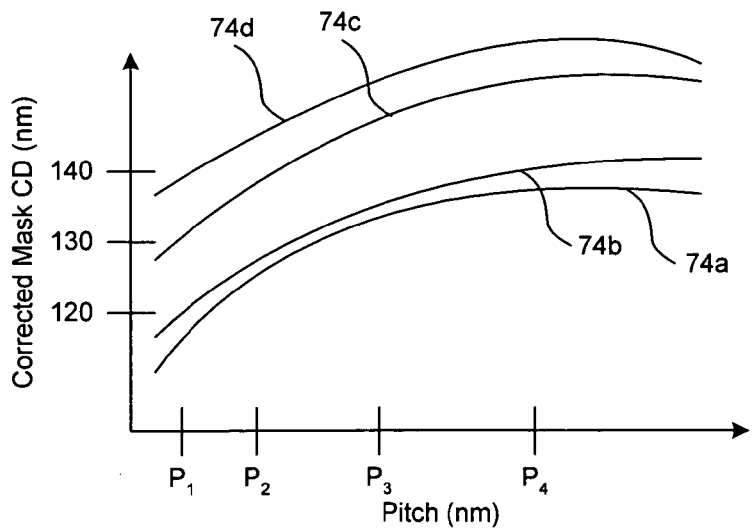
FIG. 10 is a graph of the performance of each of a plurality of OPC models.

With additional reference to FIG. 10, the data sets containing CD measurements for each corrected tech file can be embodied in a set of plots, such as the illustrated OPC model CD curves 74. Although only four example OPC model CD curves 74 are illustrated, it should be appreciated that any number of OPC model CD curves 74 as are needed to graph the performance of each OPC model under varying illumination parameters can be plotted. In the example, the curves 74 show corrected reticle opening CD size (y-axis) through a range of pitches for each OPC model. As an example, OPC model CD curve 74a can represent the corrected mask CDs for openings 70 from the corrected tech file having extracted CD measurements over a range of pitches for a first OPC model. Similarly, OPC model CD curve 74b can represent the corrected mask CDs over a range of pitches for a second OPC model; OPC model CD curve 74c can represent the corrected mask CDs over a range of pitches for a third OPC model; and OPC model CD curve 74d can represent the corrected mask CDs over a range of pitches for a fourth OPC model. In other embodiments, the data sets of extracted CD measurements can be embodied in other forms, such as in a database structure or in one or more tables. As indicated, the illustrated curves 74 are for corrected openings corresponding to simulated contact holes that each have a constant target CD. It should be appreciated that if the target CD of the simulated contact holes is variable, the OPC model CD curves 74 can contain additional data to account for the CD variations, such as additional curves and/or data points.

Next, the processing can continue in block 76 where the simulated data sets for the OPC models are compared against experimental results to evaluate the performance of the OPC models. It is noted that the curves 74 of FIG. 10 can be considered to be graphs of the performance of each OPC model for a constant or variable target contact hole CD. If the target contact hole CD for correction in block 66 is the same as the target contact hole CD used to generate target curve 60 (FIG. 7), curve 60 can be considered to be a standard against which the OPC model CD curves 74 can be measured. Therefore, the curves 74 can be compared against the target curve 60 using any suitable curve or data comparison technique. In one embodiment, a difference between the target curve 60 and each OPC model CD curve 74 can be derived. If desired, the difference between the target curve 60 and each OPC model CD curve 74 can be plotted for each pitch value.

Thereafter, in block 78, verification of the OPC model(s) can be made. Verification can include confirming that the corrections made by the OPC model fall within an acceptable level of tolerance. In one embodiment, the difference between the target curve 60 and the OPC model CD curve 74 can be used as a parameter for verification.

If multiple models are used to correct the test pattern 68 in block 66, one of the OPC models for use in making corrections to an actual integrated circuit layout can be selected. In one embodiment, selection can be made by determining which curve 74 has the smallest difference to curve 60. In the illustrated example, curve 74b has the smallest difference to curve 60. Therefore, the OPC model corresponding to curve 74b can be selected for use in correcting the integrated circuit layout.

As should be appreciated, the comparisons made to verify and/or select one or more OPC models are based on a comparison of known mask CD values over pitch that can predictably print a target CD value (e.g., the experimentally derived data from the method of FIG. 3) versus simulated mask CD values over pitch (e.g., the OPC correction data derived in the method of FIG. 8).

In one embodiment, the collected data can be used in conjunction with an OPC model optimization procedure. For example, program loops can be established to vary illumination parameters associated with the OPC routine. CD values from the corrected tech files can be compared against data collected from the data sets derived from measured contact hole arrays (e.g., curve 60) to find an optimal set of illumination parameters and/or expression of the OPC model.

Although embodiments of a method of collecting wafer test measurement data and a method of verifying and/or selecting an OPC model have been described and illustrated as following a specific order of steps, one skilled in the art will appreciate that variations to the methods exist and these variations are intended to fall within the scope of the invention as defined by the claims appended hereto. For example, certain illustrated blocks and/or steps can be omitted. In addition, other blocks and/or steps can be added. The order of execution of various blocks and/or steps can be carried out in an order other than the order shown or described. Also, certain blocks and/or steps can be carried out concurrently or with partial concurrence.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of verifying an optical proximity correction (OPC) model for use with an OPC simulation tool that manipulates an integrated circuit layout corresponding to a layer to be embodied in a wafer by a photolithographic technique, the method comprising:
    a) correcting a test pattern having a plurality of structures with the OPC simulation tool using the OPC model to generate a corrected output file for the test pattern;
    b) extracting critical dimension (CD) values from the corrected output file for layout locations corresponding to a plurality of selected structures of the test pattern;
    c) developing a data set from the extracted CD values, the data set indicative of corrected test pattern CD versus pitch for at least one target CD and the data set from the extracted CD values includes a plot of corrected test pattern CD versus pitch;
    d) comparing the data set for the extracted CD values with an experimentally derived data set, the experimentally derived data set indicative of reticle opening CD versus pitch that when imaged using the photolithographic technique produce wafer structures having the at least one target CD and the experimentally derived data set includes a plot of actual reticle opening CD that can be used to print the at least one target CD versus pitch, and wherein the comparing is carried out by establishing a difference between the plots; and
    wherein a), b), c) and d) are carried out for each of a plurality of OPC models and the method further comprises selecting one of the plurality of OPC models that has the closest correlation between compared data sets.

2. The method according to claim 1, wherein the structures of the test pattern and the reticle openings correspond to contact holes.

3. The method according to claim 1, wherein a), b), c) and d) are carried out for a plurality of illumination parameter combinations.

4. The method according to claim 1, wherein deriving the experimentally derived data set includes:
    providing a wafer having the wafer structures, the wafer structures formed by imaging the wafer with a reticle having openings arranged to have variations in CD and pitch;
    measuring selected wafer structures; and
    back correlating the measured wafer structures to corresponding reticle opening CD values.

5. The method according to claim 4, wherein the measuring is conducted by a measurement tool under the control of an automated script executed by a computer system.

6. The method according to claim 4, wherein the reticle openings are further arranged to include variations in X/Y bias.

7. The method according to claim 1, wherein the extraction of CD values from the corrected output file is carried out by an automated script executed by a computer system.

* * * * *